(12) United States Patent
Schwarzenbach et al.

(10) Patent No.: US 12,176,244 B2
(45) Date of Patent: Dec. 24, 2024

(54) METHOD FOR BONDING TWO SUBSTRATES

(71) Applicant: Soitec, Bernin (FR)

(72) Inventors: Walter Schwarzenbach, Saint Nazaire les Eymes (FR); Laurent Viravaux, Bernin (FR)

(73) Assignee: Soitec, Bernin (FR)

( * ) Notice: Subject to any disclaimer, the term of this patent is extended or adjusted under 35 U.S.C. 154(b) by 132 days.

(21) Appl. No.: 17/756,431

(22) PCT Filed: Nov. 24, 2020

(86) PCT No.: PCT/FR2020/052160
§ 371 (c)(1),
(2) Date: May 25, 2022

(87) PCT Pub. No.: WO2021/105605
PCT Pub. Date: Jun. 3, 2021

(65) Prior Publication Data
US 2023/0032336 A1 Feb. 2, 2023

(30) Foreign Application Priority Data
Nov. 25, 2019 (FR) ...................................... 1913162

(51) Int. Cl.
*H01L 21/762* (2006.01)
*H01L 21/67* (2006.01)

(52) U.S. Cl.
CPC .. *H01L 21/76254* (2013.01); *H01L 21/67092* (2013.01)

(58) Field of Classification Search
CPC ......... H01L 21/76254; H01L 21/67092; H01L 21/67115
See application file for complete search history.

(56) References Cited

FOREIGN PATENT DOCUMENTS

| EP | 1964166 B1 | 1/2016 |
| JP | 2009-517855 A | 4/2009 |
| JP | 2015211122 A * | 11/2015 |
| WO | 2008/107029 A1 | 9/2008 |

OTHER PUBLICATIONS

JP 2015-211122 (Year: 2015).*
French Search Report for Application No. 876974 dated Jun. 18, 2020, 6 pages.
International Search Report for Application No. PCT/FR2020/052160 dated Feb. 22, 2021, 2 pages.
International Written Opinion for Application No. PCT/FR2020/052160 dated Feb. 22, 2021, 7 pages.
Japanese Notice of Reasons for Rejections for Application No. 2022-527147 dated Jul. 9, 2024, 8 pages with English translation.

* cited by examiner

*Primary Examiner* — Dale E Page
*Assistant Examiner* — Quovaunda Jefferson
(74) *Attorney, Agent, or Firm* — TraskBritt

(57) ABSTRACT

A method for bonding a first substrate and a second substrate comprises bringing the first and second substrates into contact and implementing heating of a peripheral zone of at least one of the first and second substrates. The heating is initiated before the substrates are brought into contact and continued at least until the substrates are brought into contact in the zone. The heating is implemented by an infrared lamp configured to emit radiation having an outer boundary corresponding to the edge of the substrates.

16 Claims, 6 Drawing Sheets

METHOD FOR BONDING TWO SUBSTRATES

CROSS-REFERENCE TO RELATED APPLICATIONS

This application is a national phase entry under 35 U.S.C. § 371 of International Patent Application PCT/FR2020/052160, filed Nov. 24, 2020, designating the United States of America and published as International Patent Publication WO 2021/105605 A1 on Jun. 3, 2021, which claims the benefit under Article 8 of the Patent Cooperation Treaty to French Patent Application Serial No. FR1913162, filed Nov. 25, 2019.

TECHNICAL FIELD

The present disclosure relates to a method for bonding a first substrate and a second substrate.

BACKGROUND

Bonding methods, in particular, bonding by molecular adhesion, are widely used in the production of semiconductor substrates.

In particular, to produce semiconductor-on-insulator substrates, especially silicon-on-insulator (SOI) substrates, it is known practice to bond a first semiconductor substrate to a second substrate, which might or might not be a semiconductor substrate, with the surface of at least one of the substrates being covered with an oxide layer so as to produce oxide/semiconductor or oxide/oxide bonding.

Bonding by molecular adhesion does not require the application of any adhesive; with the surfaces to be bonded being perfectly smooth, bonding is generally initiated by locally applying a slight pressure to the substrates, generating a bonding wave, which then propagates across the entire extent of the bonding interface.

However, it has been identified that the bonding process could be the cause of "edge-void" defects in semiconductor-on-insulator substrates. These defects appear when, after bonding, a thin layer is transferred from the first substrate (also called the donor substrate) to the second substrate (also called the receiver substrate), for example, by detaching the first substrate along a weakened zone previously formed in the substrate. This layer transfer method is known as the Smart Cut™ method.

Edge voids are holes that extend through the transferred thin layer and through the oxide layer located at the bonding interface. These holes typically have a diameter of 50 μm to 2 mm and are generally located at the periphery of the semiconductor-on-insulator substrate.

As illustrated in FIG. 1, which illustrates a view from above of the surface of the transferred thin layer 1 of an SOI substrate, when bonding is initiated at one edge of the substrates to be bonded (zone A), edge voids are generally generated at the opposite edge, in zone B, where the propagation of the bonding wave 11 ends.

Edge voids are therefore serious and often crippling defects, insofar as an electronic component formed in or on a region of the transferred thin layer comprising such an edge void will be defective.

Document WO 2008/107029 describes a method for bonding a first substrate and a second substrate in which, to limit the formation of such edge voids, at least one of the substrates is heated before and while the substrates are brought into contact, so as to control the speed of propagation of the bonding wave.

This heating is localized to the peripheral zone in which the edge voids are concentrated, and is implemented by means of a halogen lamp arranged in a quartz housing facing the zone.

However, the heating tends to degrade the carrier (or "chuck"), which holds the substrates during bonding. Specifically, this carrier is formed of a metal base covered with a polymer coating, which separates from the base and deforms, forming blisters under the effect of overly intense heating. However, this damage to the carrier is liable to generate other defects, in particular, non-bonded zones, in the final substrate.

If it is sought to reduce the damage to the carrier by decreasing the duration or the intensity of the heating, the speed of propagation of the bonding wave risks being insufficiently controlled, leading to the formation of edge voids.

Furthermore, this method suffers from a lack of stability over time and is therefore not very reproducible.

BRIEF SUMMARY

One object of the present disclosure is therefore to define a method for bonding substrates that makes it possible to minimize the formation of edge voids while being more stable and more reproducible than the existing method, and which does not cause damage to the substrate carrier.

To that end, the present disclosure provides a method for bonding a first substrate and a second substrate, comprising bringing the first and second substrates into contact and implementing heating of a peripheral zone of at least one of the first and second substrates, the heating being initiated before the substrates are brought into contact and continued at least until the substrates are brought into contact in the zone, the method being characterized in that the heating is implemented by means of an infrared lamp configured to emit radiation having an outer boundary corresponding to the edge of the substrates.

Due to the type of radiation and the arrangement of the lamp with respect to the substrates, it is possible to more effectively heat the water present at the bonding interface, which strongly influences the bonding kinetics, with lower power, while reducing the heating of the substrates and, in particular, of the substrate carrier.

In some embodiments, the first and second substrates have a circular shape and the infrared lamp has the shape of an arc of a circle whose diameter is smaller than or equal to the diameter of the substrates.

In some embodiments, the first and second substrates are held by a carrier having a peripheral region running around the edge of the substrates, the infrared lamp being arranged so as to heat the peripheral zone of the first and/or of the second substrate while excluding the peripheral region of the carrier.

Particularly advantageously, the heating ends at the latest at the end of propagation of the bonding wave between the substrates.

According to one preferred embodiment, the infrared lamp emits radiation in a wavelength range suitable for absorption of the radiation by water present between the substrates.

Another subject of the present disclosure relates to a method for producing a semiconductor-on-insulator substrate, by transferring a semiconductor layer from a first semiconductor substrate, called the donor substrate, to a second substrate, called the receiver substrate, comprising:

forming a weakened zone in the donor substrate, so as to delimit a semiconductor layer to be transferred, providing a receiver substrate, at least one of the donor substrate and of the receiver substrate being covered with an electrically insulating layer, bonding the first substrate and the receiver substrate using the method as described above, the electrically insulating layer being at the bonding interface, detaching the donor substrate along the weakened zone so as to transfer the semiconductor layer to the receiver substrate.

Another subject of the present disclosure relates to an installation allowing the implementation of this method.

The installation comprises a carrier configured to hold the first and second substrates as they are brought into contact, the carrier having a peripheral region running around the edge of the substrates, and a lamp arranged facing a peripheral zone of at least one of the first and second substrates, and is characterized in that the lamp is an infrared lamp configured to emit radiation having an outer boundary corresponding to the edge of the substrates, so as not to expose the peripheral region of the carrier to the radiation.

According to one embodiment, the infrared lamp is designed to emit a fast medium wave. This means that the wavelength of the emitted radiation is longer than 1 µm.

In some embodiments, the infrared lamp comprises a filament designed to be brought to a temperature of approximately 1600° C. during operation of the lamp.

Advantageously, the infrared lamp has a power peak for a wavelength of between 1.5 and 2 µm. Thus, the lamp promotes the absorption of the radiation by water more than by the semiconductor material, which makes it possible to reduce the heating of the carrier and prevents the formation of defects liable to result therefrom.

BRIEF DESCRIPTION OF THE DRAWINGS

Further features and advantages of the present disclosure will become apparent from the following detailed description, with reference to the appended drawings, in which.

For the sake of legibility of the figures, the various layers of the substrates and/or the components of the installation are not necessarily shown to scale.

DETAILED DESCRIPTION

The present disclosure proposes modifying not only the heat source but also the shape of the source.

In the prior art, the halogen lamp takes the shape of a rectilinear bar. However, since substrates are usually circular in shape, the halogen lamp irradiates only part of the periphery of the substrates.

Figure 1:
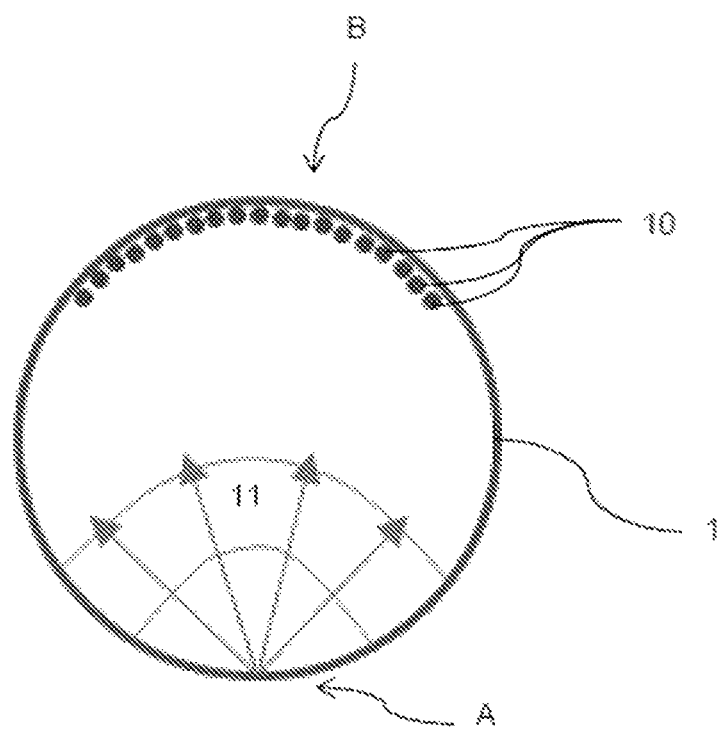
FIG. 1 is a view of the surface of an SOI substrate, schematically showing the propagation of the bonding wave and the formation of edge voids.
Figure 2:
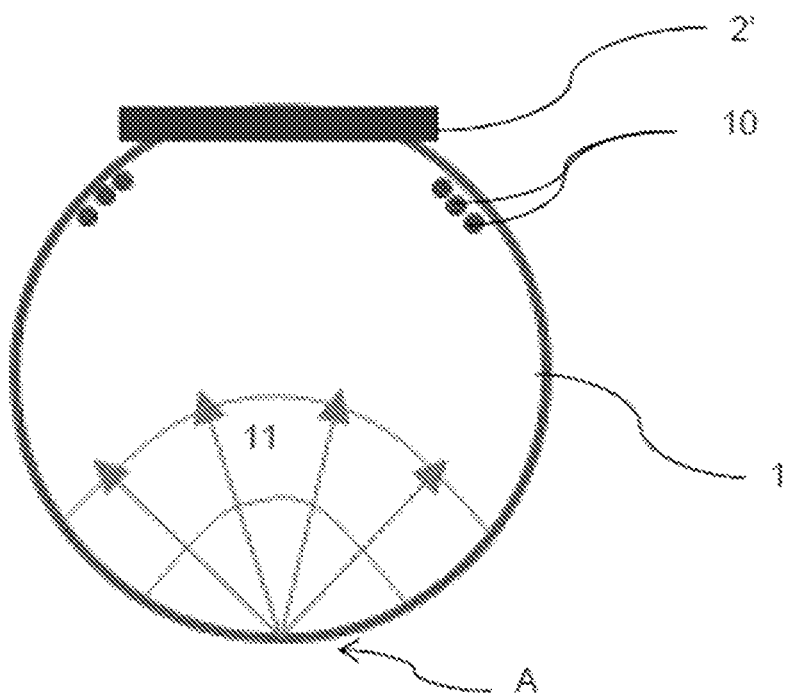
FIG. 2 is a view of the surface of an SOI substrate, in which the halogen lamp as described in document WO 2008/107029 is shown schematically.

As illustrated in FIG. 2, the lamp 2' is arranged tangentially to the edge of the substrates, on the side opposite zone A in which the bonding wave is initiated. Due to its width, the lamp 2' illuminates a strip of the substrates running from the edge toward the center of the substrates. This strip corresponds to a portion of a chord of a circle, which intersects the edge of the substrates at two zones, the zones of intersection being spaced apart by an angle of approximately 60°.

However, edge voids typically extend over an angular sector of 120° opposite the zone of initiation of the bonding wave.

As a result, as shown schematically in FIG. 2, edge voids 10 remain on either side of the peripheral zone illuminated by the lamp 2'.

Figure 7:
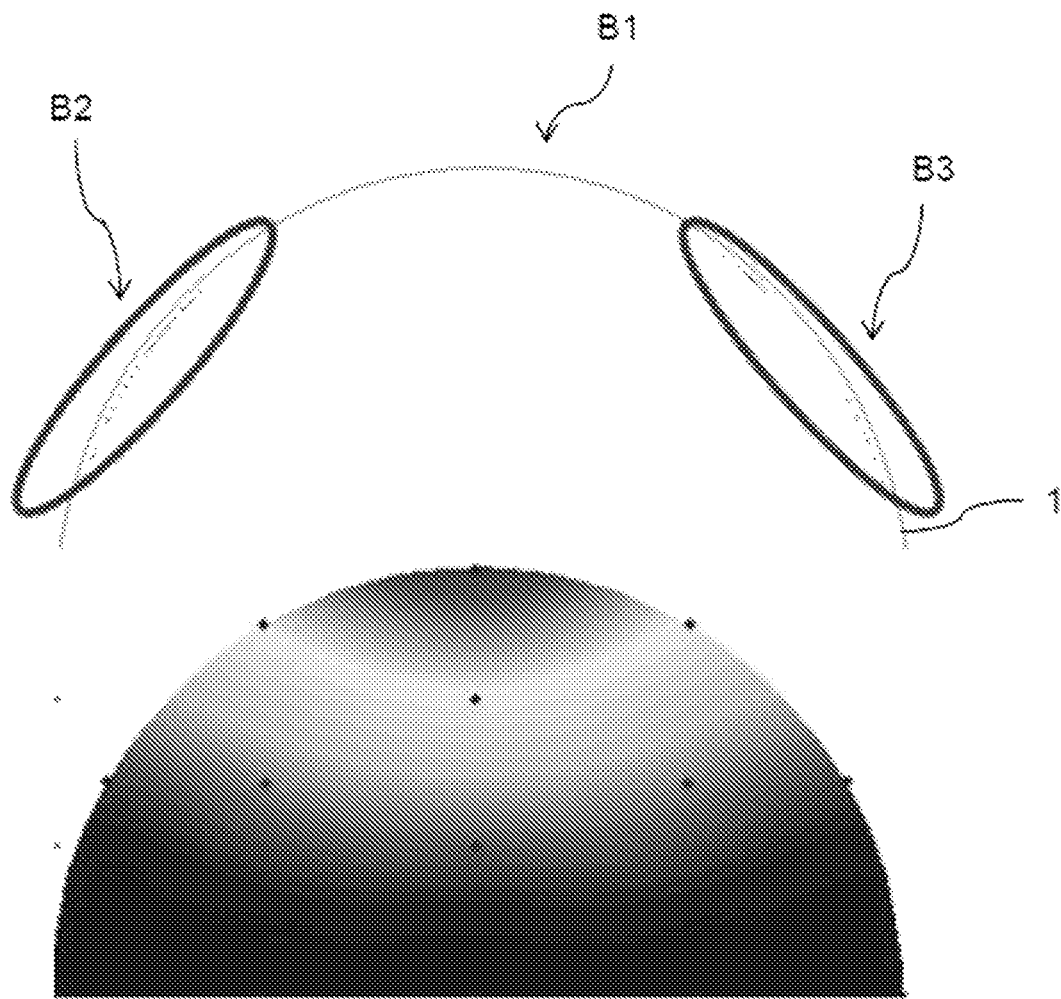
FIG. 7 is a view of the surface of an SOI substrate with edge voids formed in a zone insufficiently heated by the halogen lamp in the known bonding method.

These remaining edge voids are highlighted in FIG. 7.

Figure 3:
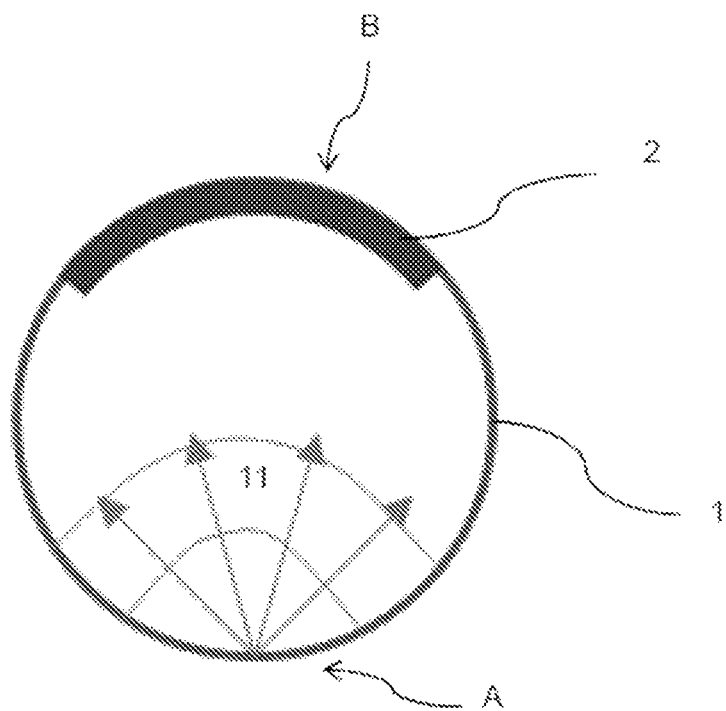
FIG. 3 is a view of the surface of an SOI substrate, in which an infrared lamp according to the present disclosure is shown schematically.

With reference to FIG. 3, what is proposed is a lamp 2 configured to emit radiation with an outer boundary corresponding to the edge of the substrates.

In other words, in the case of circular substrates, the lamp 2 takes the shape of an arc of a circle whose diameter is smaller than or equal to the diameter of the substrates. The length of the lamp is chosen so as to occupy an angular sector on the order of 120° with respect to the periphery of the substrates.

Thus, the lamp 2 illuminates all or at least most of the zone in which edge voids are liable to occur. In addition, the lamp illuminates only the zone to be treated, while excluding other zones of the substrates and the carrier holding the substrates, thereby avoiding or minimizing damage to the latter by the heat generated.

Furthermore, the lamp 2 is not a halogen lamp, but an infrared lamp.

In a manner known per se, the infrared lamp comprises an electrically conductive filament, generally made of tungsten, arranged in a tube that is transparent to infrared radiation, for example, a quartz tube. When an electric current flows therethrough, the filament is brought to a high temperature and emits infrared radiation. Advantageously, the lamp comprises a reflector arranged along the filament in order to direct the radiation in a preferred direction.

Preferably, the infrared lamp is chosen from lamps that emit fast medium waves. In such a lamp, the filament is brought to a temperature of about 1600° C.

In comparison with a halogen lamp, the infrared lamp has two significant advantages.

On the one hand, it allows greater stability of heating over time, which affords greater repeatability and better reliability of the bonding process.

On the other hand, it emits radiation in a wider wavelength range than the halogen lamp, which is more favorable for controlling the speed of the bonding wave while being less aggressive for the substrates and the underlying carrier.

Figure 4:
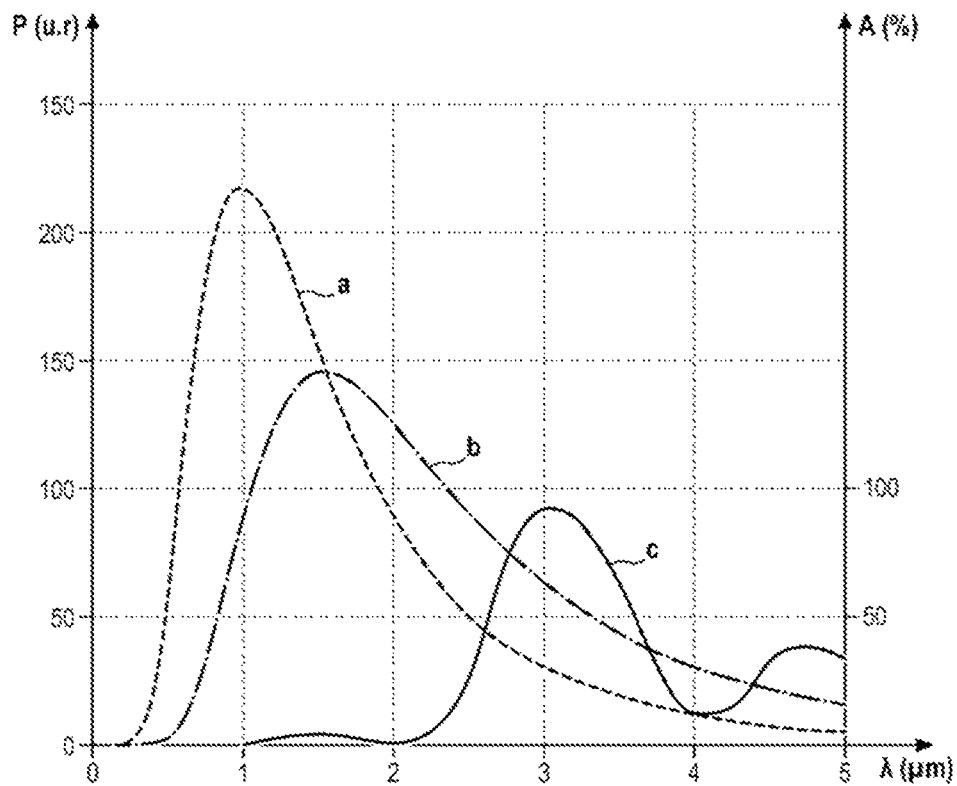
FIG. 4 is a graph showing the emission spectra of a halogen lamp and of an infrared lamp, and the absorption spectrum of water as a function of wavelength.

FIG. 4 is a graph showing the emission spectra of a halogen lamp used in the known bonding method (curve a) and of an infrared lamp used in the bonding method according to the present disclosure (curve b), and the absorption spectrum of water (curve c) as a function of wavelength λ. The left-hand ordinate axis represents the power P of the radiation (in relative units u.r) emitted by the two lamps and the right-hand ordinate axis represents the coefficient of absorption A (in %) of water.

The absorption of the radiation in water is of interest because water is strongly involved in the bonding kinetics of the substrates. Specifically, a small amount of water (on the order of a few monolayers) adsorbed on the surface of the substrates is necessary to ensure the adhesion of the substrates by van der Waals forces. However, too much water decreases the bonding energy. The heating provided by the lamp must therefore be intense enough to remove excess water while keeping enough water adsorbed on the surface of the substrates.

It is observed that the power peak of the infrared lamp is at a higher wavelength (between 1.5 and 2 μm) than the power peak of the halogen lamp (which is of the order of 1 μm), such that water absorbs the radiation emitted by the infrared lamp to a greater extent than that emitted by the halogen lamp (water exhibiting significant absorption in a range between 2.5 and 3.7 μm).

Conversely, the radiation from the halogen lamp is absorbed more by the silicon of the substrates, which on the one hand is less useful in controlling the bonding energy and on the other hand contributes to heating through conduction of the carrier holding the substrates.

In addition, the power of the infrared lamp is lower than that of the halogen lamp.

It will be noted that, although the halogen lamp emits in the near infrared in addition to the visible range, it should not be considered akin to an infrared lamp according to the present disclosure. Indeed, the radiation from an infrared lamp in the visible range is negligible; in other words, the infrared lamp emits primarily thermal radiation.

The temperature of the filament of the halogen lamp (on the order of 2600° C.) is higher than that of the filament of the infrared lamp, which, as mentioned above, is on the order of 1600° C.

The shape of the lamp may be matched to the shape of the substrates by using an elongated curved tube containing a filament whose radius of curvature is identical to that of the substrates, or by juxtaposing multiple tubes along a curve whose radius of curvature is identical to that of the substrates.

The change in technology and in the shape of the lamp therefore makes it possible to reduce thermal damage to the carrier.

Figure 5:
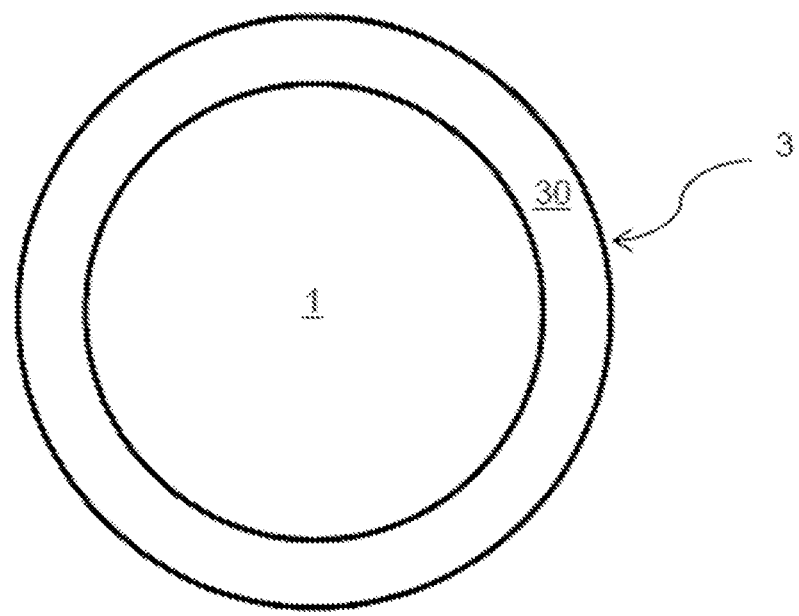
FIG. 5 schematically illustrates a substrate held on a carrier for the bonding step.

The carrier is shown schematically in a view from above in FIG. 5, holding the substrates to be bonded. The carrier 3 comprises a central portion covered by the substrates and a peripheral portion 30 running around the substrates and optionally comprising means for securing the substrates (not shown). It is understood that with the rectilinear halogen lamp of the prior art, this peripheral portion was directly heated by the radiation from the lamp. Conversely, the infrared lamp according to the present disclosure does not extend over this peripheral portion 30, and so the infrared radiation does not directly heat the portion 30.

Figure 6:
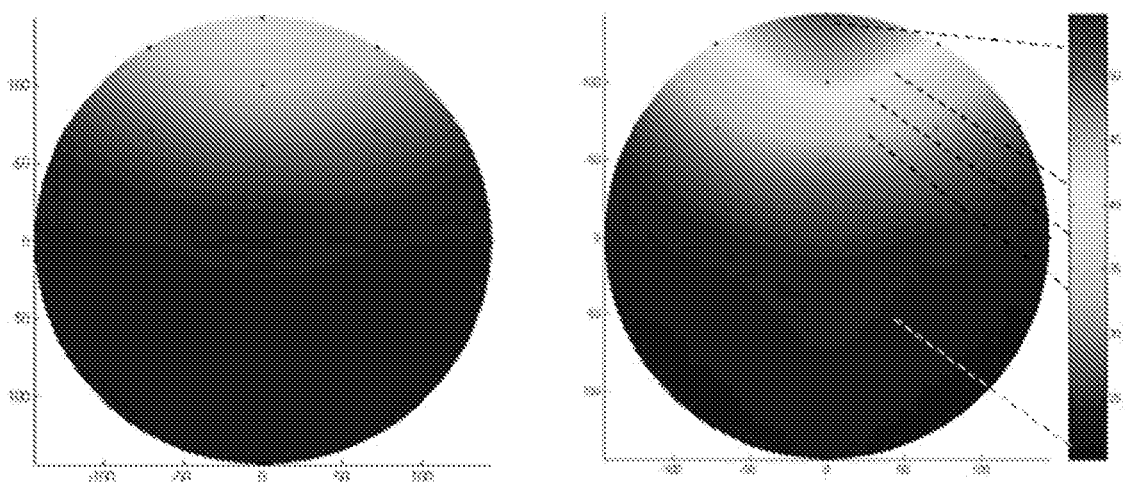
FIG. 6 shows images of a map of the temperature of the substrate carrier during heating by an infrared lamp according to the present disclosure (left-hand image) and by a halogen lamp (right-hand image)

The more favorable effect on the carrier is visible in FIG. 6, which shows images of a map of the temperature of the substrate carrier during heating of the substrates by an infrared lamp according to the present disclosure (left-hand image) and by a halogen lamp according to the prior art (right-hand image). This map was obtained using thermocouples (schematically represented by the black dots) arranged in the central portion of the carrier, beneath the substrates.

With the halogen lamp, the temperature reached on the carrier is higher (around 50 to 55° C.) than with the infrared lamp (around 35 to 40° C.). This temperature difference is enough to improve the longevity of the carrier.

FIG. 7 is an image of the surface of an SOI substrate with edge voids formed in zones insufficiently heated by the halogen lamp in the known bonding method. The temperature map displayed under this image is that of the right-hand part of FIG. 6. It is observed that region B1, which has been effectively heated by the halogen lamp and is the hottest portion, is free of edge voids. However, in the surrounding regions B2 and B3 extending on either side of region B1, which were not arranged directly under the halogen lamp, edge voids remain.

In practice, an industrial installation for bonding substrates may comprise a structure supporting the substrate carrier and the infrared lamp.

Advantageously, the carrier is arranged in a horizontal plane and the infrared lamp extends in a plane parallel to that of the carrier, above the latter.

The distance between the lamp and the carrier is great enough to allow the substrates to be handled and not to interfere with the laminar flow applied within the equipment to prevent the presence of contaminants. In practice, the distance between the lamp and the carrier may be on the order of 20 cm.

The shape of the lamp is matched to that of the substrates to be bonded. For example, when the substrates to be bonded have a diameter of 300 mm, the lamp has a radius of curvature of 150 mm at most, preferably on the order of 145 mm or less.

The lamp's reflector is arranged to direct the infrared radiation toward the substrates.

Because of the shape and arrangement of the lamp, the infrared radiation has an outer boundary, which corresponds to the edge of the carrier, such that the peripheral region of the carrier, which extends radially beyond the edge of the substrates, is not exposed to the radiation.

Figure 8A:
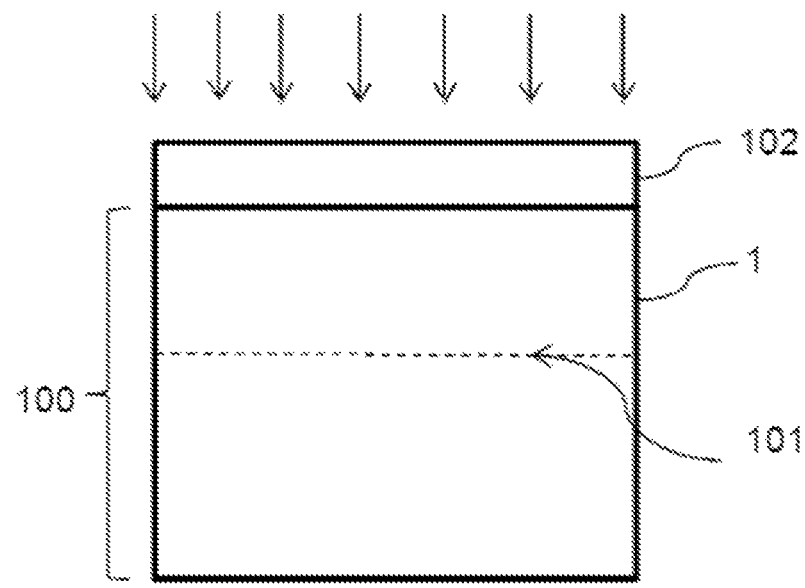
FIG. 8A is a cross-sectional view of the formation of a weakened zone within a donor substrate.
Figure 8B:
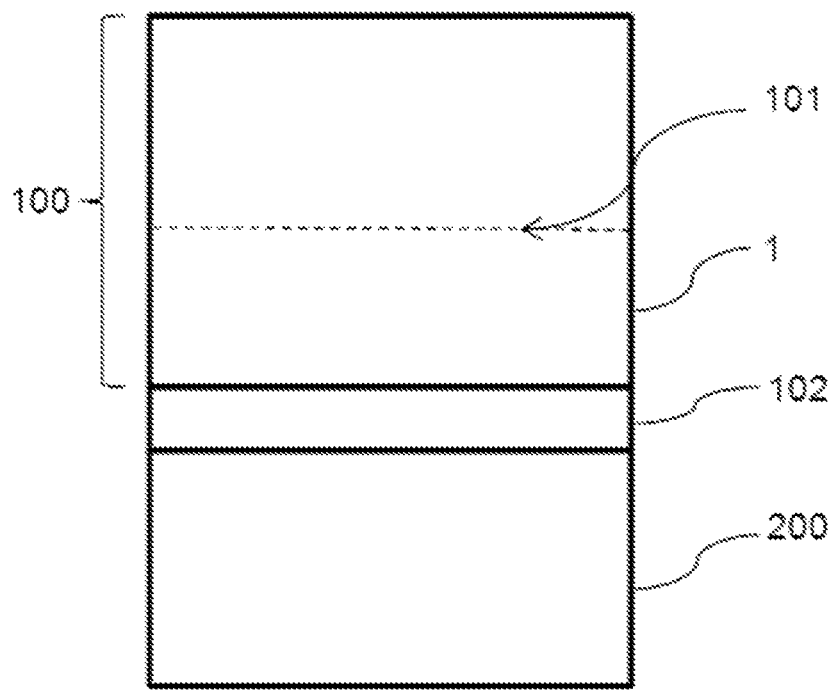
FIG. 8B is a cross-sectional view of the bonding of the donor substrate of FIG. 8A to a receiver substrate.
Figure 8C:
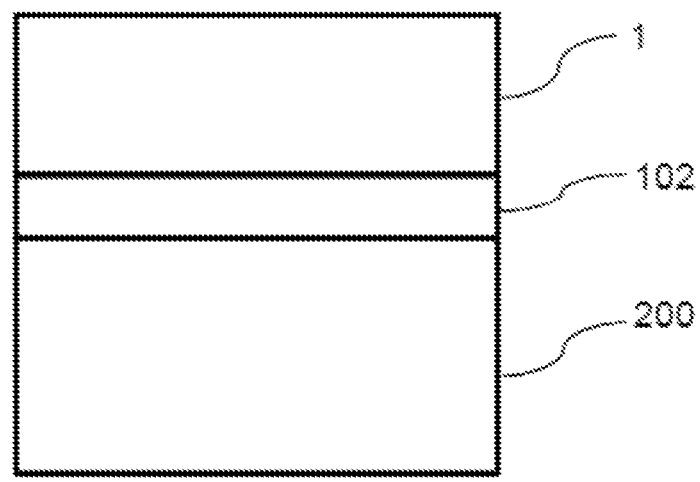
FIG. 8C is a cross-sectional view of the detachment of the donor substrate along the weakened zone so as to transfer a semiconductor layer from the donor substrate to the receiver substrate.

FIGS. 8A to 8C illustrate steps of a Smart Cut™ layer transfer method implementing the bonding method described above.

With reference to FIG. 8A, a donor substrate 100 comprising at least one semiconductor layer is provided. The substrate may be a bulk substrate or a stack of layers of different materials.

The donor substrate 100 may be covered with a dielectric layer 102, for example, a layer of silicon oxide.

Atomic species, such as hydrogen and/or helium, are implanted into the donor substrate 100 through the dielectric layer 102. A weakened zone 101 delimiting a semiconductor layer 1 to be transferred is thus formed in the donor substrate 100.

With reference to FIG. 8B, the donor substrate 100 thus weakened is bonded to a receiver substrate 200. Bonding is performed via the dielectric layer 102, with the receiver substrate potentially also being covered with a dielectric layer (for oxide-oxide bonding) or otherwise (for an oxide-semiconductor bonding). Alternatively, the dielectric layer may be present on the receiver substrate only (for semiconductor-oxide bonding).

To implement this bonding, the substrates are held on a carrier (not shown) and an infrared lamp is arranged opposite the carrier with respect to the substrates, facing the peripheral zone in which the propagation of the bonding wave should end. A bonding wave is initiated between the substrates by locally applying a slight pressure to the substrates, at the edge opposite the location of the lamp.

The infrared lamp is turned on at the latest when the substrates are brought into contact, and is turned off at the latest when the interface between the substrates has completely closed. Advantageously, the turning-on of the lamp is feedback-controlled by the movement of the device that applies the pressure required to initiate bonding to the substrates. The turning-off of the lamp may be controlled so as to take place at the end of a predetermined period after turning on. This duration is calibrated beforehand, for each set of substrates to be bonded, by measuring the speed of the bonding wave between the substrates.

Lastly, with reference to FIG. 8C, the donor substrate 100 is detached along the weakened zone 101, resulting in the layer 1 being transferred to the receiver substrate. By virtue of the bonding method implemented, the transferred layer 1 is substantially free of edge voids. Furthermore, since the carrier has not been damaged by the heating, the transferred layer 1 is also free of defects linked to the carrier, such as non-bonded zones.

The invention claimed is:

1. A method for bonding a first substrate and a second substrate, the method comprising:
   bringing the first and second substrates into contact and implementing heating of a first peripheral zone of an outer periphery of at least one of the first or second substrates, the heating being initiated before the substrates are brought into contact and continued at least until the substrates are brought into contact in the first peripheral zone; and
   initiating a bonding wave at a second peripheral zone of the outer periphery, the second peripheral zone being on an opposite side of the at least one of the first or second substrates from the first peripheral zone, wherein the heating is implemented by an infrared lamp shaped to conform to an edge of the substrates within the first peripheral zone and configured to emit radiation having an outer boundary corresponding to the edge of the substrates.

2. The method of claim 1, wherein the first and second substrates have a circular shape and the infrared lamp has a shape of an arc of a circle whose diameter is smaller than or equal to the diameter of the substrates.

3. The method of claim 2, wherein the first and second substrates are held by a carrier having a peripheral region extending around the edge of the substrates, the infrared lamp being arranged so as to heat the first peripheral zone of the at least one of the first or second substrates while excluding the peripheral region of the carrier.

4. The method of claim 3, wherein the heating ends, at the latest, at an end of propagation of the bonding wave between the substrates.

5. The method of claim 4, wherein the infrared lamp emits the radiation in a wavelength range suitable for absorption of the radiation by water present between the substrates.

6. The method of claim 2, wherein the shape of the arc of the circle of the infrared lamp extends over an angular sector of 120° opposite the first peripheral zone.

7. The method of claim 1, wherein the first and second substrates are held by a carrier having a peripheral region extending around the edge of the substrates, the infrared lamp being arranged so as to heat the first peripheral zone of the at least one of the first or second substrates while excluding the peripheral region of the carrier.

8. The method of claim 1, wherein the heating ends, at the latest, at an end of propagation of the bonding wave between the substrates.

9. The method of claim 1, wherein the infrared lamp emits the radiation in a wavelength range suitable for absorption of the radiation by water present between the substrates.

10. A method for transferring a semiconductor layer from a first semiconductor substrate comprising a donor substrate to a second substrate comprising a receiver substrate, the method comprising:
    forming a weakened zone in the donor substrate so as to delimit a semiconductor layer to be transferred;
    forming a dielectric layer on at least one of the donor substrate or the receiver substrate;
    bonding the first substrate and the second substrate using a method according to claim 1, the dielectric layer being at a bonding interface between the first substrate and the second substrate; and
    detaching the donor substrate along the weakened zone so as to transfer the semiconductor layer to the receiver substrate.

11. An installation for bonding a first substrate and a second substrate, comprising:
    a carrier configured to hold the first and second substrates as they are brought into contact, the carrier having a peripheral region extending around an edge of the first and second substrates; and
    a lamp arranged facing a peripheral zone of an outer periphery of at least one of the first or second substrates, the peripheral zone being opposite a bonding wave initiation zone of the outer periphery;
    wherein the lamp is an infrared lamp shaped to conform to the edge of the substrates within the peripheral zone and configured to emit radiation having an outer boundary corresponding to the edge of the first and second substrates, so as not to expose the peripheral region of the carrier to the radiation.

12. The installation of claim 11, wherein the infrared lamp is configured to emit a fast medium wave.

13. The installation of claim 12, wherein the infrared lamp comprises a filament configured to be heated to a temperature of approximately 1600° C. during operation of the lamp.

14. The installation of claim 13, wherein the infrared lamp has a power peak for a wavelength of between 1.5 and 2 µm.

15. The installation of claim 11, wherein the infrared lamp comprises a filament configured to be heated to a temperature of approximately 1600° C. during operation of the lamp.

16. The installation of claim 11, wherein the infrared lamp has a power peak for a wavelength of between 1.5 and 2 µm.

* * * * *